United States Patent
Nakagawa et al.

(10) Patent No.: US 7,875,317 B2
(45) Date of Patent: *Jan. 25, 2011

(54) COMPOSITION FOR FORMING INSULATING FILM, METHOD FOR PRODUCING SAME, SILICA-BASED INSULATING FILM, AND METHOD FOR FORMING SAME

(75) Inventors: Hisashi Nakagawa, Tsukuba (JP);
Masahiro Akiyama, Tsukuba (JP);
Takahiko Kurosawa, Tsukuba (JP);
Atsushi Shiota, Sunnyvale, CA (US)

(73) Assignee: JSR Corporation, Tokyo (JP)

( * ) Notice: Subject to any disclaimer, the term of this patent is extended or adjusted under 35 U.S.C. 154(b) by 1106 days.

This patent is subject to a terminal disclaimer.

(21) Appl. No.: 11/486,085

(22) Filed: Jul. 14, 2006

(65) Prior Publication Data

US 2007/0020467 A1    Jan. 25, 2007

Related U.S. Application Data

(63) Continuation of application No. PCT/JP2005/000374, filed on Jan. 14, 2005.

(30) Foreign Application Priority Data

Jan. 16, 2004    (JP)    .............................. 2004-009205
May 11, 2004    (JP)    .............................. 2004-141200

(51) Int. Cl.
*B05D 3/02* (2006.01)
*C08L 83/04* (2006.01)
*C08L 83/16* (2006.01)

(52) U.S. Cl. ....................... 427/387; 427/489; 427/515; 525/477; 528/21; 528/35; 528/39

(58) Field of Classification Search .................. None
See application file for complete search history.

(56) References Cited

U.S. PATENT DOCUMENTS

| | | | | |
|---|---|---|---|---|
| 3,980,729 A | * | 9/1976 | Yokokawa et al. | .......... 525/480 |
| 4,220,600 A | | 9/1980 | Yajima et al. | |
| 6,251,313 B1 | * | 6/2001 | Deubzer et al. | .............. 264/4.1 |
| 6,807,041 B2 | | 10/2004 | Geiger et al. | |
| 6,933,360 B2 | * | 8/2005 | Ko et al. | ........... 528/30 |
| 7,128,976 B2 | * | 10/2006 | Hayashi et al. | .............. 428/447 |
| 7,528,207 B2 | * | 5/2009 | Nakagawa et al. | ............. 528/21 |
| 2004/0000715 A1 | * | 1/2004 | Interrante et al. | ........... 257/758 |
| 2004/0007753 A1 | | 1/2004 | Seki et al. | |
| 2005/0096415 A1 | | 5/2005 | Akiyama et al. | |
| 2006/0006541 A1 | | 1/2006 | Tsuchiya et al. | |
| 2006/0024980 A1 | | 2/2006 | Tsuchiya et al. | |
| 2006/0210812 A1 | | 9/2006 | Shiota | |
| 2007/0015892 A1 | * | 1/2007 | Nakagawa et al. | ............. 528/25 |
| 2007/0031687 A1 | * | 2/2007 | Akiyama et al. | ............. 428/447 |

FOREIGN PATENT DOCUMENTS

| | | | |
|---|---|---|---|
| JP | 54-61299 | | 5/1979 |
| JP | 4-100873 | * | 4/1992 |
| JP | 5-105759 | | 4/1993 |
| JP | 5-263045 | | 10/1993 |
| JP | 5-315319 | | 11/1993 |
| JP | 11-340219 | | 12/1999 |
| JP | 11-340220 | | 12/1999 |
| JP | 2000-309752 | | 11/2000 |
| JP | 2000-336169 | * | 12/2000 |
| JP | 2001-127152 | | 5/2001 |
| JP | 2001-345317 | | 12/2001 |
| JP | 2003-115482 | | 4/2003 |
| JP | 2005-76031 | | 3/2005 |
| WO | WO 02/098955 | | 12/2002 |

OTHER PUBLICATIONS

U.S. Appl. No. 11/596,295, filed Nov. 13, 2006, Akiyama, et al.
U.S. Appl. No. 11/596,188, filed Nov. 13, 2006, Akiyama, et al.
U.S. Appl. No. 12/278,224, filed Aug. 4, 2008, Nakagawa, et al.
U.S. Appl. No. 11/432,345, filed May 12, 2006, Shiota.
U.S. Appl. No. 11/484,604, filed Jul. 12, 2006, Nakagawa, et al.
U.S. Appl. No. 11/485,508, filed Jul. 13, 2006, Nakagawa, et al.
U.S. Appl. No. 11/489,468, filed Jul. 20, 2006, Akiyama, et al.
U.S. Appl. No. 11/580,959, filed Oct. 16, 2006, Akiyama, et al.
U.S. Appl. No. 12/473,861, filed May 28, 2009, Nobe, et al.
U.S. Appl. No. 12/527,327, filed Aug. 14, 2009, Nakagawa, et al.
U.S. Appl. No. 12/717,225, filed Mar. 4, 2010, Akiyama, et al.
U.S. Appl. No. 12/749,735, filed Mar. 30, 2010, Nobe, et al.

* cited by examiner

*Primary Examiner*—Marc S Zimmer
(74) *Attorney, Agent, or Firm*—Oblon, Spivak, McClelland, Maier & Neustadt, L.L.P.

(57) ABSTRACT

An insulating-film-forming composition includes: a hydrolysis-condensation product obtained by hydrolyzing and condensing a hydrolyzable-group-containing silane monomer (A) in the presence of a polycarbosilane (B) and a basic catalyst (C); and an organic solvent.

15 Claims, No Drawings

COMPOSITION FOR FORMING INSULATING FILM, METHOD FOR PRODUCING SAME, SILICA-BASED INSULATING FILM, AND METHOD FOR FORMING SAME

CROSS REFERENCE TO RELATED APPLICATION

This application is a continuation of International Patent Application No. PCT/JP2005/000374, having an international filing date of Jan. 14, 2005, which designated the United States, the entirety of which is incorporated herein by reference. Japanese Patent Application No. 2004-009205, filed on Jan. 16, 2004, and Japanese Patent Application No. 2004-141200, filed on May 11, 2004, are also incorporated herein by reference in their entirety.

BACKGROUND OF THE INVENTION

The present invention relates to an insulating-film-forming composition, a method of producing the same, a silica-based insulating film, and a method of forming the same. More particularly, the invention relates to an insulating-film-forming composition suitably used for an interlayer dielectric for semiconductor devices or the like, a method of producing the same, a silica-based insulating film, and a method of forming the same.

A silica ($SiO_2$) film formed by a vacuum process such as chemical vapor deposition (CVD) has been widely used as an interlayer dielectric for semiconductor devices and the like. In recent years, a coating-type insulating film called a spin-on-glass (SOG) film containing a tetraalkoxysilane hydrolyzate as the major component has also been used in order to form an interlayer dielectric with a more uniform thickness. Along with an increase in the degree of integration of semiconductor devices, a low-relative-dielectric-constant interlayer dielectric called an organic SOG film containing a polyorganosiloxane as the major component has been developed.

However, more excellent electrical insulation between conductors has been demanded accompanying a further increase in the degree of integration and the number of layers of semiconductor devices. Therefore, an interlayer dielectric exhibiting excellent storage stability, a lower relative dielectric constant, and higher mechanical strength has been in demand.

The manufacture of semiconductor devices involves a chemical mechanical planarization (CMP) step for planarizing an insulating layer and various washing steps. Therefore, a material used for an interlayer dielectric or a protective film for semiconductor devices is required to exhibit mechanical strength and chemical resistance against chemical corrosion in addition to dielectric constant characteristics.

As a material exhibiting a low relative dielectric constant, a composition containing fine particles obtained by condensing an alkoxysilane in the presence of ammonia and a basic partial hydrolyzate of an alkoxysilane (JP-A-5-263045 and JP-A-5-315319), and a coating liquid obtained by condensing a basic hydrolyzate of a polyalkoxysilane in the presence of ammonia (JP-A-11-340219 and JP-A-11-340220) have been proposed. However, the material obtained by the above method is not suitable for industrial production since the reaction product exhibits unstable properties and the resulting coating shows a large change in relative dielectric constant, crack resistance, mechanical strength, adhesion, and the like.

A method of forming a low-dielectric-constant insulating film using a coating liquid prepared by mixing a polycarbosilane solution and a polysiloxane solution has also been proposed (JP-A-2001-127152 and JP-A-2001-345317). However, this method has a problem in that the carbosilane domains and the polysiloxane domains are unevenly distributed in the resulting coating.

A method has also been proposed which uses an organosilicate polymer obtained by hydrolysis-condensation of a carbon bridge-containing silane oligomer prepared from an organometallic silane compound (WO2002-98955). However, a material obtained by this method cannot be stored for a long time due to poor stability of the reaction product. Moreover, this material exhibits poor adhesion to a substrate.

A method of forming a low-dielectric-constant insulating film by hydrolysis-condensation of a highly branched polycarbosilane has been proposed (U.S. Pat. No. 6,807,041). However, since aging using ammonia, trimethylsilylization, curing at a high temperature of 500° C., and the like are required after applying the polymer to a substrate, this method is not suitable for practical use.

SUMMARY

An object of the invention is to provide an insulating-film-forming composition which may be suitably used for semiconductor devices and the like for which an increase in the degree of integration and the number of layers has been demanded and may form an insulating film exhibiting a low relative dielectric constant and excellent mechanical strength, storage stability, and chemical resistance, and a method of producing the same.

Another object of the invention is to provide a silica-based insulating film exhibiting a low relative dielectric constant and excellent mechanical strength, storage stability, and chemical resistance, and a method of forming the same.

An insulating-film-forming composition according to one aspect of the invention comprises a hydrolysis-condensation product obtained by hydrolyzing and condensing a hydrolyzable-group-containing silane monomer (A) (hereinafter also referred to as "component A") in the presence of a polycarbosilane (B) (hereinafter also referred to as "component B") and a basic catalyst (C), and an organic solvent.

In this insulating-film-forming composition, the component (B) may include a hydrolyzable group.

In this insulating-film-forming composition, the component (A) may be at least one silane compound selected from the group consisting of compounds of the following general formulas (1) to (3),

$$R_a Si(OR^1)_{4-a} \quad (1)$$

wherein R represents a hydrogen atom, a fluorine atom, or a monovalent organic group, $R^1$ represents a monovalent organic group, and a represents 1 or 2,

$$Si(OR^2)_4 \quad (2)$$

wherein $R^2$ represents a monovalent organic group,

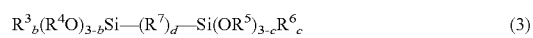

$$R^3{}_b(R^4 O)_{3-b}Si-(R^7)_d-Si(OR^5)_{3-c}R^6{}_c \quad (3)$$

wherein $R^3$ to $R^6$ individually represent monovalent organic groups, b and c individually represent integers from 0 to 2, $R^7$ represents an oxygen atom, a phenylene group, or a group —$(CH_2)_m$— (wherein m represents an integer from 1 to 6), and d represents 0 or 1, and the component (B) may be a polycarbosilane compound of the following general formula (4),

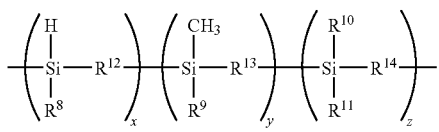

wherein $R^8$ represents a group selected from the group consisting of a hydrogen atom, a halogen atom, a hydroxyl group, an alkoxy group, an acyloxy group, a sulfone group, a methanesulfone group, a trifluoromethanesulfone group, an alkyl group, an aryl group, an allyl group, and a glycidyl group, $R^9$ represents a group selected from the group consisting of a halogen atom, a hydroxyl group, an alkoxy group, an acyloxyl group, a sulfone group, a methanesulfone group, a trifluoromethanesulfone group, an alkyl group, an aryl group, an allyl group, and a glycidyl group, $R^{10}$ and $R^{11}$ individually represent groups selected from the group consisting of a halogen atom, a hydroxyl group, an alkoxy group, an acyloxyl group, a sulfone group, a methanesulfone group, a trifluoromethanesulfone group, an alkyl group having 2 to 6 carbon atoms, an aryl group, an allyl group, and a glycidyl group, $R^{12}$ to $R^{14}$ individually represent a substituted or unsubstituted methylene group, a substituted or unsubstituted alkylene group, a substituted or unsubstituted alkenyl group, a substituted or unsubstituted alkynyl group, or a substituted or unsubstituted arylene group, and x, y, and z individually represent integers from 0 to 10,000, provided that "5<x+y+z<10,000" is satisfied.

In this insulating-film-forming composition, the amount of the component (B) may be 1 to 1,000 parts by weight for 100 parts by weight of the component (A) converted into a complete hydrolysis-condensation product.

In this insulating-film-forming composition, the basic catalyst (C) may be a nitrogen-containing compound of the following general formula (5),

wherein $X^1$, $X^2$, $X^3$, and $X^4$ individually represent groups selected from the group consisting of a hydrogen atom, an alkyl group having 1 to 20 carbon atoms, a hydroxyalkyl group, an aryl group, and an arylalkyl group, Y represents a halogen atom or an anionic group with a valence of 1 to 4, and a represents an integer from 1 to 4.

A method of producing an insulating-film-forming composition according to one aspect of the invention comprises hydrolyzing and condensing a hydrolyzable-group-containing silane monomer (A) in the presence of a polycarbosilane (B) and a basic catalyst (C).

The method of producing an insulating-film-forming composition may further comprise dissolving a hydrolysis-condensation product obtained by the hydrolysis and condensation in an organic solvent.

In this method of producing an insulating-film-forming composition, the component (B) may include a hydrolyzable group.

In this method of producing an insulating-film-forming composition, the component (A) may be at least one silane compound selected from the group consisting of compounds of the following general formulas (1) to (3), $$R_aSi(OR^1)_{4-a} \quad (1)$$

wherein R represents a hydrogen atom, a fluorine atom, or a monovalent organic group, $R^1$ represents a monovalent organic group, and a represents 1 or 2, $$Si(OR^2)_4 \quad (2)$$

wherein $R^2$ represents a monovalent organic group, $$R^3{}_b(R^4O)_{3-b}Si-(R^7)_d-Si(OR^5)_{3-c}R^6{}_c \quad (3)$$

wherein $R^3$ to $R^6$ individually represent monovalent organic groups, b and c individually represent integers from 0 to 2, $R^7$ represents an oxygen atom, a phenylene group, or a group $-(CH_2)_m-$ (wherein m represents an integer from 1 to 6), and d represents 0 or 1, and the component (B) may be a polycarbosilane compound of the following general formula (4),

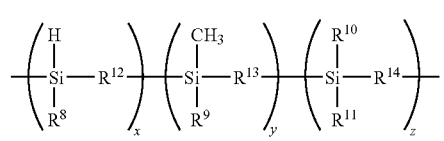

wherein $R^8$ represents a group selected from the group consisting of a hydrogen atom, a halogen atom, a hydroxyl group, an alkoxy group, an acyloxyl group, a sulfone group, a methanesulfone group, a trifluoromethanesulfone group, an alkyl group, an aryl group, an allyl group, and a glycidyl group, $R^9$ represents a group selected from the group consisting of a halogen atom, a hydroxyl group, an alkoxy group, an acyloxyl group, a sulfone group, a methanesulfone group, a trifluoromethanesulfone group, an alkyl group, an aryl group, an allyl group, and a glycidyl group, $R^{10}$ and $R^{11}$ individually represent groups selected from the group consisting of a halogen atom, a hydroxyl group, an alkoxy group, an acyloxyl group, a sulfone group, a methanesulfone group, a trifluoromethanesulfone group, an alkyl group having 2 to 6 carbon atoms, an aryl group, an allyl group, and a glycidyl group, $R^{12}$ to $R^{14}$ individually represent a substituted or unsubstituted methylene group, a substituted or unsubstituted alkylene group, a substituted or unsubstituted alkenyl group, a substituted or unsubstituted alkynyl group, or a substituted or unsubstituted arylene group, and x, y, and z individually represent integers from 0 to 10,000, provided that "5<x+y+z<10,000" is satisfied.

In this method of producing an insulating-film-forming composition, the amount of the component (B) may be 1 to 1,000 parts by weight for 100 parts by weight of the component (A) converted into a complete hydrolysis-condensation product.

In this method of producing an insulating-film-forming composition, the basic catalyst (C) may be a nitrogen-containing compound of the following general formula (5),

wherein $X^1$, $X^2$, $X^3$, and $X^4$ individually represent groups selected from the group consisting of a hydrogen atom, an alkyl group having 1 to 20 carbon atoms, a hydroxyalkyl group, an aryl group, and an arylalkyl group, Y represents a halogen atom or an anionic group with a valence of 1 to 4, and a represents an integer from 1 to 4.

A method of forming a silica-based insulating film according to one aspect of the invention comprises applying the above-described insulating-film-forming composition to a substrate to form a coating, and subjecting the coating to at least one curing treatment selected from heating, electron beam irradiation, ultraviolet irradiation, and oxygen plasma treatment.

A silica-based insulating film according to one aspect of the invention is obtained by the above-described method of forming a silica-based insulating film.

The above-described film-forming composition includes the hydrolysis-condensation product obtained by hydrolyzing and condensing the hydrolyzable-group-containing silane monomer (A) in the presence of the polycarbosilane (B) and the basic catalyst (C). In the hydrolysis and condensation, the hydrolyzable-group-containing silane monomer (A) is hydrolyzed to form a silanol group (—Si—OH), and a silanol group (—Si—OH) is also produced in the polycarbosilane (B) by hydrolysis. Since the above reaction occurs in the presence of the basic catalyst (C) and the hydrolysis products are condensed to form an Si—O—Si bond, a highly three-dimensionally branched hydrolysis-condensation product having a high molecular weight can be obtained. Therefore, an insulating film having a relative low dielectric constant can be formed by using the insulating-film-forming composition.

The hydrolysis-condensation product has a structure in which the polycarbosilane (B) is incorporated in a three-dimensional structure by forming a chemical bond with the polysiloxane produced from the hydrolyzable-group-containing silane monomer (A). Therefore, an insulating film which exhibits high mechanical strength, excellent adhesion, superior chemical resistance and does not undergo phase separation can be obtained by using the above insulating-film-forming composition.

In the above-described method of producing an insulating-film-forming composition, since the hydrolysis-condensation product can be obtained under comparatively mild conditions by hydrolyzing and condensing the hydrolyzable-group-containing silane monomer (A) in the presence of the polycarbosilane (B) and the basic catalyst (C), the reaction can be easily controlled.

The above-described method of forming a silica-based insulating film includes applying the above insulating-film-forming composition to a substrate to form a coating, and subjecting the coating to at least one curing treatment selected from heating, electron beam irradiation, ultraviolet irradiation, and oxygen plasma treatment. The resulting silica-based insulating film has a low relative dielectric constant, exhibits excellent mechanical strength, adhesion, and chemical resistance, and does not undergo phase separation.

DETAILED DESCRIPTION OF THE EMBODIMENT

Some embodiments of the invention will now be described in detail.

1. Film-Forming-Composition and Method of Producing the Same

The film-forming composition (insulating-film-forming composition) according to one embodiment of the invention includes a hydrolysis-condensation product (hereinafter referred to as "specific hydrolysis-condensation product") obtained by hydrolyzing and condensing the component (A) in the presence of the component (B) and the basic catalyst (C), and an organic solvent. Each component is described below.

1.1. Component (A)

The component (A) is at least one silane compound selected from a compound of the following general formula (1) (hereinafter referred to as "compound 1"), a compound of the following general formula (2) (hereinafter referred to as "compound 2"), and a compound of the following general formula (3) (hereinafter referred to as "compound 3"),

$$R_aSi(OR^1)_{4-a} \qquad (1)$$

wherein R represents a hydrogen atom, a fluorine atom, or a monovalent organic group, $R^1$ represents a monovalent organic group, and a represents an integer of 1 or 2,

$$Si(OR^2)_4 \qquad (2)$$

wherein $R^2$ represents a monovalent organic group,

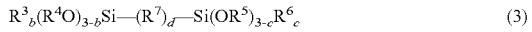

$$R^3{}_b(R^4O)_{3-b}Si—(R^7)_d—Si(OR^5)_{3-c}R^6{}_c \qquad (3)$$

wherein $R^3$ to $R^6$ individually represent monovalent organic groups, b and c individually represent integers from 0 to 2, $R^7$ represents an oxygen atom, a phenylene group, or a group —$(CH_2)_m$— (wherein m represents an integer from 1 to 6), and d represents 0 or 1.

The term "hydrolyzable group" used herein refers to a group which may be hydrolyzed during the production of the film-forming composition according to this embodiment of the invention. Specific examples of the hydrolyzable group include a hydrogen atom bonded to a silicon atom, a halogen atom, a hydroxyl group, alkoxy group, acyloxy group, sulfone group, methanesulfone group, and trifluoromethanesulfone group. Note that the hydrolyzable group is not limited thereto.

1.1.1. Compound 1

As examples of the monovalent organic group represented by R and $R^1$ in the general formula (1), an alkyl group, an aryl group, an allyl group, a glycidyl group, a vinyl group, and the like can be given. It is preferable that the monovalent organic group represented by R in the general formula (1) be an alkyl group or a phenyl group. As examples of the alkyl group, a methyl group, an ethyl group, a propyl group, a butyl group, and the like can be given. The alkyl group preferably has 1 to 5 carbon atoms. These alkyl groups may be either linear or branched, and in which a hydrogen atom may be replaced with fluorine atom, amino group, or the like. As examples of the aryl group in the general formula (1), a phenyl group, a naphthyl group, a methylphenyl group, an ethylphenyl group, a chlorophenyl group, a bromophenyl group, a fluorophenyl group, and the like can be given.

As specific examples of the compound 1, methyltrimethoxysilane, methyltriethoxysilane, methyltri-n-propoxysilane, methyltriisopropoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltriisopropoxysilane, ethyltri-n-butoxysilane, ethyltri-sec-butoxysilane, ethyltri-tert-butoxysilane, ethyltriphenoxysilane, n-propyltrimethoxysilane, n-propyltriethoxysilane, n-propyltri-n-propoxysilane, n-propyltriisopropoxysilane, n-propyltri-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane, secbutyltrimethoxysilane, sec-butyliso-triethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, vinyltrimethoxysilane, vinyltriethoxysilane, vinyltri-n-propoxysilane, vinyltri-iso-propoxysilane, vinyltri-n-butoxysilane, vinyltri-sec-butoxysilane, vinyltri-tert-butoxysilane, vinyltriphenoxysilane, trimethoxysilane, triethoxysilane, tri-n-propoxysilane, tri-iso-propoxysilane, tri-n-butoxysilane, tri-sec-butoxysilane, tri-tert-butoxysilane, triphenoxysilane, dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldiethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldi-phenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldi-phenoxysilane, di-sec-butyldimethoxysilane, di-sec-butyldiethoxysilane, di-sec-butyldi-n-propoxysilane, di-sec-butyldiisopropoxysilane, di-sec-butyldibutyldi-n-butoxysilane, di-sec-butyldi-sec-butoxysilane, di-sec-butyldi-tert-butoxy silane, di-sec-butyldi-phenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldi-phenoxysilane, diphenyldimethoxysilane, diphenyldi-ethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, divinyldimethoxysilane, gamma-aminopropyltrimethoxysilane, gamma-aminopropyltriethoxysilane, gamma-glycidoxypropyltrimethoxysilane, gamma-glycidoxypropyltriethoxysilane, gamma-trifluoropropyltrimethoxysilane, and gamma-trifluoropropyltriethoxysilane are can be given. These compounds may be used either individually or in combination of two or more.

Of these particularly preferable compounds as the compound 1 are methyltrimethoxysilane, methyltriethoxysilane, methyltri-n-propoxysilane, methyltri-iso-propoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, diphenyldiethoxysilane, and the like.

1.1.2. Compound 2

As examples of the monovalent organic group represented by $R^2$ in the general formula (2), the groups illustrated for R and $R^1$ in the general formula (1) can be given.

As specific examples of the compound 2, tetramethoxysilane, tetraethoxysilane, tetra-n-propoxysilane, tetra-iso-propoxysilane, tetra-n-butoxysilane, tetra-sec-butoxysilane, tetra-tert-butoxysilane, tetraphenoxysilane, and the like can be given. Of these, tetramethoxysilane and tetraethoxysilane are particularly preferable. These compounds may be used either individually or in combination of two or more.

1.1.3. Compound 3

As examples of the monovalent organic group represented by $R^3$ to $R^6$ in the general formula (3), the groups for R and $R^1$ in the general formula (1) can be given.

As examples of the compound of the general formula (3) in which d is 0, hexamethoxydisilane, hexaethoxydisilane, hexaphenoxydisilane, 1,1,1,2,2-pentamethoxy-2-methyldisilane, 1,1,1,2,2-pentaethoxy-2-methyldisilane, 1,1,1,2,2-pentaphenoxy-2-methyldisilane, 1,1,1,2,2-pentamethoxy-2-ethyldisilane, 1,1,1,2,2-pentaethoxy-2-ethyldisilane, 1,1,1,2,2-pentaphenoxy-2-ethyldisilane, 1,1,1,2,2-pentamethoxy-2-phenyldisilane, 1,1,1,2,2-pentaethoxy-2-phenyldisilane, 1,1,1,2,2-pentaphenoxy-2-phenyldisilane, 1,1,2,2-tetramethoxy-1,2-dimethyldisilane, 1,1,2,2-tetraethoxy-1,2-dimethyldisilane, 1,1,2,2-tetraphenoxy-1,2-dimethyldisilane, 1,1,2,2-tetramethoxy-1,2-diethyldisilane, 1,1,2,2-tetraethoxy-1,2-diethyldisilane, 1,1,2,2-tetraphenoxy-1,2-diethyldisilane, 1,1,2,2-tetramethoxy-1,2-diphenyldisilane, 1,1,2,2-tetraethoxy-1,2-diphenyldisilane, 1,1,2,2-tetraphenoxy-1,2-diphenyldisilane, 1,1,2-trimethoxy-1,2,2-trimethyldisilane, 1,1,2-triethoxy-1,2,2-trimethyldisilane, 1,1,2-triphenoxy-1,2,2-trimethyldisilane, 1,1,2-trimethoxy-1,2,2-triethyldisilane, 1,1,2-triethoxy-1,2,2-triethyldisilane, 1,1,2-triphenoxy-1,2,2-triethyldisilane, 1,1,2-trimethoxy-1,2,2-triphenyldisilane, 1,1,2-triethoxy-1,2,2-triphenyldisilane, 1,1,2-triphenoxy-1,2,2-triphenyldisilane, 1,2-dimethoxy-1,1,2,2-tetramethyldisilane, 1,2-diethoxy-1,1,2,2-tetramethyldisilane, 1,2-diphenoxy-1,1,2,2-tetramethyldisilane, 1,2-dimethoxy-1,1,2,2-tetraethyldisilane, 1,2-diethoxy-1,1,2,2-tetraethyldisilane, 1,2-diphenoxy-1,1,2,2-tetraethyldisilane, 1,2-dimethoxy-1,1,2,2-tetraphenyldisilane, 1,2-diethoxy-1,1,2,2-tetraphenyldisilane, 1,2-diphenoxy-1,1,2,2-tetraphenyldisilane, and the like can be given.

Of these compounds, hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, 1,2-diethoxy-1,1,2,2-tetraphenyldisilane, and the like are preferable.

As examples of the compound 3 of the general formula (3) in which $R^7$ is the group $—(CH_2)_m—$, bis(trimethoxysilyl)methane, bis(triethoxysilyl)methane, bis(tri-n-propoxysilyl)methane, bis(tri-iso-propoxysilyl)methane, bis(tri-n-butoxysilyl)methane, bis(tri-sec-butoxysilyl)methane, bis(tri-tert-butoxysilyl)methane, 1,2-bis(trimethoxysilyl)ethane, 1,2-bis(triethoxysilyl)ethane, 1,2-bis(tri-n-propoxysilyl)ethane, 1,2-bis(tri-iso-propoxysilyl)ethane, 1,2-bis(tri-n-butoxysilyl)ethane, 1,2-bis(tri-sec-butoxysilyl)ethane, 1,2-bis(tri-tert-butoxysilyl)ethane, 1-(dimethoxymethylsilyl)-1-(trimethoxysilyl)methane, 1-(diethoxymethylsilyl)-1-

(triethoxysilyl)methane, 1-(di-n-propoxymethylsilyl)-1-(tri-n-propoxysilyl)methane, 1-(di-iso-propoxymethylsilyl)-1-(tri-iso-propoxysilyl)methane, 1-(di-n-butoxymethylsilyl)-1-(tri-n-butoxysilyl)methane, 1-(di-sec-butoxymethylsilyl)-1-(tri-sec-butoxysilyl)methane, 1-(di-tert-butoxymethylsilyl)-1-(tri-tert-butoxysilyl)methane, 1-(dimethoxymethylsilyl)-2-(trimethoxysilyl)ethane, 1-(diethoxymethylsilyl)-2-(triethoxysilyl)ethane, 1-(di-n-propoxymethylsilyl)-2-(tri-n-propoxysilyl)ethane, 1-(di-iso-propoxymethylsilyl)-2-(tri-iso-propoxysilyl)ethane, 1-(di-n-butoxymethylsilyl)-2-(tri-n-butoxysilyl)ethane, 1-(di-sec-butoxymethylsilyl)-2-(tri-sec-butoxysilyl)ethane, 1-(di-tert-butoxymethylsilyl)-2-(tri-tert-butoxysilyl)ethane, bis(dimethoxymethylsilyl)methane, bis(diethoxymethylsilyl)methane, bis(di-n-propoxymethylsilyl)methane, bis(di-iso-propoxymethylsilyl)methane, bis(di-n-butoxymethylsilyl)methane, bis(di-sec-butoxymethylsilyl)methane, bis(di-tert-butoxymethylsilyl)methane, 1,2-bis(dimethoxymethylsilyl)ethane, 1,2-bis(diethoxymethylsilyl)ethane, 1,2-bis(di-n-propoxymethylsilyl)ethane, 1,2-bis(di-iso-propoxymethylsilyl)ethane, 1,2-bis(di-n-butoxymethylsilyl)ethane, 1,2-bis(di-sec-butoxymethylsilyl)ethane, 1,2-bis(di-tert-butoxymethylsilyl)ethane, 1,2-bis(trimethoxysilyl)benzene, 1,2-bis(triethoxysilyl)benzene, 1,2-bis(tri-n-propoxysilyl)benzene, 1,2-bis(tri-iso-propoxysilyl)benzene, 1,2-bis(tri-n-butoxysilyl)benzene, 1,2-bis(tri-sec-butoxysilyl)benzene, 1,2-bis(tri-tert-butoxysilyl)benzene, 1,3-bis(trimethoxysilyl)benzene, 1,3-bis(triethoxysilyl)benzene, 1,3-bis(tri-n-propoxysilyl)benzene, 1,3-bis(tri-iso-propoxysilyl)benzene, 1,3-bis(tri-n-butoxysilyl)benzene, 1,3-bis(tri-sec-butoxysilyl)benzene, 1,3-bis(tri-tert-butoxysilyl)benzene, 1,4-bis(trimethoxysilyl)benzene, 1,4-bis(triethoxysilyl)benzene, 1,4-bis(tri-n-propoxysilyl)benzene, 1,4-bis(tri-iso-propoxysilyl)benzene, 1,4-bis(tri-n-butoxysilyl)benzene, 1,4-bis(tri-sec-butoxysilyl)benzene, 1,4-bis(tri-tert-butoxysilyl)benzene, and the like can be given.

Of these compounds, bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene, and the like are preferable. These compounds 1 to 3 may be used either individually or in combination of two or more.

When subjecting the compounds 1 to 3 to hydrolysis and partial condensation, it is preferable to use water in an amount of 0.1 to 100 mol for one mole of the groups represented by $R^1O-$, $R^2O-$, $R^4O-$, and $R^5O-$ in the general formulas (1) to (3). The complete hydrolysis-condensation product used herein refers to a product in which the groups represented by $R^1O-$, $R^2O-$, $R^4O-$, and $R^5O-$ in the condensate are completely hydrolyzed to form —OH groups and are completely condensed.

1.2. Component (B)

The component (B) is described below. The component (B) according to the invention is a polycarbosilane which may be condensed with the component (A) to form an Si—O—Si bond. For example, the component (B) may be a polycarbosilane compound of the following general formula (4) (hereinafter also referred to as "compound 4"). In the following description, the component (B) also includes the polycarbosilane compound dissolved in an organic solvent.

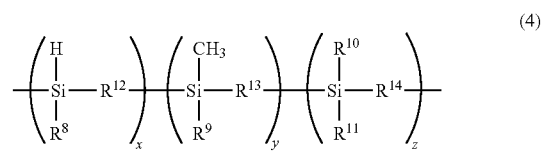

(4)

In the general formula (4), $R^8$ represents a hydrogen atom, a halogen atom, a hydroxyl group, an alkoxy group, a sulfone group, a methanesulfone group, a trifluoromethanesulfone group, an alkyl group, an aryl group, an allyl group, and a glycidyl group, $R^9$ represents a halogen atom, a hydroxyl group, an alkoxy group, a sulfone group, a methanesulfone group, a trifluoromethanesulfone group, an alkyl group, an aryl group, an allyl group, and a glycidyl group, $R^{10}$ and $R^{11}$ individually represent a halogen atom, a hydroxyl group, an alkoxy group, a sulfone group, a methanesulfone group, a trifluoromethanesulfone group, an alkyl group having 2 to 6 carbon atoms, an aryl group, an allyl group, and a glycidyl group, and $R^{12}$ to $R^{14}$ represent a substituted or unsubstituted methylene group, alkylene group, alkenyl group, alkynyl group, or arylene group.

As examples of the halogen atom, a fluorine atom, chlorine atom, bromine atom, and the like can be given. As examples of the alkoxy group, a methoxy group, an ethoxy group, a propyloxy group, a butoxy group, and the like can be given. As examples of the acyloxyl group, an acetyloxy group, a propyonyl group, and the like can be given. As examples of the alkyl group, a methyl group, ethyl group, propyl group, butyl group, hexyl group, cyclohexyl group, and the like can be given. As examples of the aryl group, a phenyl group, a naphthyl group, a methylphenyl group, an ethylphenyl group, a chlorophenyl group, a bromophenyl group, a fluorophenyl group, and the like can be given.

As examples of the alkylene group, a methylene group, a propylene group, a butylene group, a hexylene group, a decylene group, and the like can be given. The alkylene group preferably includes 2 to 6 carbon atoms. The alkylene group may be either linear or branched. A hydrogen atom in the alkylene group may be replaced by a fluorine atom or the like. In the general formula (4), as examples of the alkenyl group, an ethenylene group, propenylene group, 1-butenylene group, 2-butenylene group, and the like can be given. The alkenyl group may be a dienylene group. The alkenyl group preferably has 1 to 4 carbon atoms. A hydrogen atom in the alkenyl group may be replaced by a fluorine atom or the like. As examples of the alkynyl group, an acetylene group, a propynylene group, and the like can be given. As examples of the arylene group, a phenylene group, a naphthylene group, and the like can be given. A hydrogen atom in the arylene group may be replaced by a fluorine atom or the like.

In the general formula (4), x, y, and z individually represent integers from 0 to 10,000, provided that "x+y+z" is greater than 5 and less than 10,000. If "x+y+z" is less than 5, the film-forming composition may exhibit inferior storage stability. If "x+y+z" is greater than 10,000, since the component (B) may be separated from the component (A), a uniform film may not be formed. It is preferable that x, y, and z be respectively "$0 \leq x \leq 800$", "$0 \leq y \leq 500$", and "$0 \leq z \leq 1,000$", more preferably "$0 \leq x < 500$", "$0 \leq y \leq 300$", and "$0 \leq z \leq 500$", and still more preferably "$0 \leq x \leq 100$", "$0 \leq y \leq 50$", and "$0 \leq z \leq 100$".

In the general formula (4), it is preferable that x, y, and z satisfy "5<x+y+z<1,000", more preferably "5<x+y+z<500", still more preferably "5<x+y+z<250", and most preferably "5<x+y+z<100".

As the mixing ratio of the component (A) and the component (B), the amount of the component (B) is preferably 1 to 1,000 parts by weight, more preferably 5 to 200 parts by weight, and still more preferably 5 to 100 parts by weight for 100 parts by weight of the component (A) (complete hydrolysis-condensation product). If the amount of the component (B) is less than 1 part by weight, the resulting film may not exhibit sufficient chemical resistance; if more than 1,000 parts by weight, the resulting film may not have a low dielectric constant.

The polystyrene-reduced weight average molecular weight of the component (B) is preferably 400 to 50,000, more preferably 500 to 10,000, and still more preferably 500 to 3,000. If the polystyrene-reduced number average molecular weight of the component (B) exceeds 50,000, the component (A) and the component (B) may undergo phase separation, whereby a uniform film may not be formed.

When producing the hydrolysis-condensation product of the film-forming composition according to this embodiment of the invention, the component (A) may be hydrolyzed and condensed using the compound 4 as the component (B) in the presence of the basic catalyst (C) and the component (B) to promote hydrolysis and condensation of the component (A) hydrolysis and condensation of the component (B) and the polysiloxane originating from the component (A). In this case, the resulting hydrolysis-condensation product has a structure in which the polymer having the component (B) (polycarbosilane) as a nucleus is incorporated into a three-dimensional structure of the polysiloxane originating from the component (A) (hydrolyzable group-containing silane monomer). The insulating-film-forming composition according to this embodiment containing the above hydrolysis-condensation product allows production of an insulating film which exhibits a low dielectric constant, high mechanical strength, excellent adhesion, and superior chemical resistance and does not undergo phase separation.

1.3. Basic Catalyst (C)

When producing the hydrolysis-condensation product of the film-forming composition, the number of branches of the molecular chain and the molecular weight of the hydrolysis-condensation product can be increased by using the basic catalyst (C). This allows a hydrolysis-condensation product having the above structure to be obtained.

As examples of the basic catalyst (C), methanolamine, ethanolamine, propanolamine, butanolamine, N-methylmethanolamine, N-ethylmethanolamine, N-propylmethanolamine, N-butylmethanolamine, N-methylethanolamnine, N-ethylethanolamine, N-propylethanolamine, N-butylethanolamine, N-methylpropanolamine, N-ethylpropanolamine, N-propylpropanolamine, N-butylpropanolamine, N-methylbutanolamine, N-ethylbutanolamine, N-propylbutanolamine, N-butylbutanolamine, N,N-dimethylmethanolamine, N,N-diethylmethanolamine, N,N-dipropylmethanolamine, N,N-dibutylmetanolamine, N,N-dimethylethanolamine, N,N-diethylethanolamine, N,N-dipropylethanolamine, N,N-dibutylethanolamine, N,N-dimethylpropanolamine, N,N-diethylpropanolamine, N,N-dipropylpropanolamine, N,N-dibutylpropanolamine, N,N-dimethylbutanolamine, N,N-diethylbutanolamine, N,N-dipropylbutanolamine, N,N-dibutylbutanolamine, N-methyldimethanolamine, N-ethyldimethanolamine, N-propyldimethanolamine, N-butyldimethanolamine, N-methyldiethanoleamine, N-ethyldiethanolamine, N-propyldiethanolamine, N-butyldiethanolamine, N-methyldipropanolamine, N-ethyldipropanolamine, N-propyldipropanolamine, N-butyldipropanolamine, N-methyldibutanolamine, N-ethyldibutanolamine, N-propyldibutanolamine, N-butyldibutanolamine, N-(aminomethyl)methanolamine, N-(aminomethyl)ethanolamine, N-(aminomethyl)propanolamine, N-(aminomethyl)butanolaniine, N-(aminoethyl)methanolamine, N-(aminoethyl)ethanolamine, N-(aminoethyl)propanolamine, N-(aminoethyl)butanolamine, N-(aminopropyl)methanolamine, N-(aminopropyl)ethanolamine, N-(aminopropyl)propanolamine, N-(aminopropyl)butanolamine, N-(aminobutyl)methanolamine, N-(aminobutyl)ethanolamine, N-(aminobutyl)propanolamine, N-(aminobutyl)butanolamine, methoxymethylamine, methoxyethylamine, methoxypropylamine, methoxybutylamine, ethoxymethylamine, ethoxyethylamine, ethoxypropylamine, ethoxybutylamine, propoxymethylamine, propoxyethylamine, propoxypropylamine, propoxybutylamine, butoxymethylamine, butoxyethylamine, butoxypropylamine, butoxybutylamine, methylamine, ethylamine, propylamine, butylamine, N,N-dimethylamine, N,N-diethylamine, N,N-dipropylamine, N,N-dibutylamine, trimethylamine, triethylamine, tripropylamine, tributylamine, tetramethylammonium hydroxide, tetraethylammonium hydroxide, tetrapropylammonium hydroxide, tetrabutylammonium hydroxide, tetramethylethylenediamine, tetraethylethylenediamine, tetrapropylethylenediamine, tetrabutylethylenediamine, methylaminomethylamine, methylaminoethylamine, methylaminopropylamine, methylaminobutylamine, ethylaminomethylamine, ethylaminoethylamine, ethylaminopropylamine, ethylaminobutylamine, propylaminomethylamine, propylaminoethylamine, propylaminopropylamine, propylaminobutylamine, butylaminomethylamine, butylaminoethylamine, butylaminopropylamine, butylaminobutylamine, pyridine, pyrrole, piperazine, pyrrolidine, piperidine, picoline, morpholine, methylmorpholine, diazabicyclooctane, diazabicyclononane, diazabicycloundecene, ammonia, sodium hydroxide, potassium hydroxide, barium hydroxide, calcium hydroxide, and the like can be given.

As the basic catalyst (C), a nitrogen-containing compound of the following general formula (5) (hereinafter referred to as "compound 5") is particularly preferable,

$(X^1X^2X^3X^4N)_aY$          (5)

wherein $X^1$, $X^2$, $X^3$, and $X^4$ individually represent a hydrogen atom, an alkyl group having 1 to 20 carbon atoms (preferably a methyl group, an ethyl group, a propyl group, a butyl group, a hexyl group, and the like), a hydroxyalkyl group (preferably a hydroxyethyl group and the like), an aryl group (preferably a phenyl group and the like), or an arylalkyl group (preferably a phenyl methyl group and the like), Y represents a halogen atom (preferably a fluorine atom, a chlorine atom, a bromine atom, an iodine atom, and the like) or an anionic group with a valence of 1 to 4 (preferably a hydroxyl group and the like), and a represents an integer from 1 to 4.

Specific examples of the compound 5 include tetramethylammonium hydroxide, tetraethylammonium hydroxide, tetra-n-propylammonium hydroxide, tetra-iso-propylammonium hydroxide, tetra-n-butylammonium hydroxide, tetra-iso-butylammonium hydroxide, tetra-tert-butylammonium hydroxide, tetrapentylammonium hydroxide, tetrahexylammonium hydroxide, tetraheptylammonium hydroxide, tetraoctylammonium hydroxide, tetranonylammonium hydroxide, tetradecylammonium hydroxide, tetraundecylammonium hydroxide, tetradodecylammonium hydroxide, tetramethylammonium bromide, tetramethylammonium chloride, tetraethylammonium bromide, tetraethylammonium chloride, tetra-n-propylammonium bromide, tetra-n-propylammonium chloride, tetra-n-butylammonium bromide, tetra-n-butylammonium chloride, hexadecyltrimethylammonium hydroxide, n-hexadecyltrimethylammonium bromide, n-octadecyltrimethylammonium hydroxide, n-octadecyltrimethylammonium bromide, cetyltrimethylammonium chloride, stearyltrimethylammonium chloride, benzyltrimethylammonium chloride, didecyldimethylammonium chloride, distearyldimethylammonium chloride, tridecylmethylammonium chloride, tetrabutylammonium hydrogen sulfate, tributylmethyl ammonium bromide, trioctylmethylammonium chloride, trilaurylmethylammonium chloride, benzyltrimethylammonium hydroxide, benzyltriethylammonium bromide, benzyltributylammonium bromide, phenyltrimethylammonium bromide, choline, and the like. Of these, tetramethylammonium hydroxide, tetraethylammonium hydroxide, tetra-n-propylammonium hydroxide, tetra-n-butylammonium hydroxide, tetramethylammonium bromide, tetramethylammonium chloride, tetraethylammonium bromide, tetraethylammonium chloride, tetra-n-propylammonium bromide, and tetra-n-propylammonium chloride are particularly preferable. These compounds may be used either individually or in combination of two or more.

The basic catalyst (C) is used in an amount of usually 0.0001 to 1 mol and preferably 0.001 to 0.1 mol, for one mol of the component (A) (total amount of the compounds 1 to 3).

1.4. Method of Producing Specific Hydrolysis-Condensation Product

The specific hydrolysis-condensation product may be obtained by hydrolyzing and condensing the component (A) in the presence of the component (B) and the basic catalyst (C).

The component (A) may be hydrolyzed in a state in which the component (A) and the component (B) dissolved in an organic solvent. As examples of the organic solvent, alcohols such as methanol, ethanol, n-propanol, iso-propanol, n-butanol, iso-butanol, sec-butanol, and t-butanol; polyhydric alcohols such as ethylene glycol, 1,2-polyethylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol partial ether solvents such as ethylene glycol monomethylether, ethylene glycol monoethylether, ethylene glycol monopropylether, and ethylene glycol monobutylether; ether solvents such as ethylether, iso-propylether, n-butylether, n-hexylether, 2-ethylhexylether, ethylene oxide, 1,2-propylene oxide, dioxolane, 4-methyldioxolane, dioxane, dimethyldioxane, ethylene glycol monomethylether, ethylene glycol dimethylether, ethylene glycol monoethylether, and ethylene glycol diethylether; ketone solvents such as acetone, methyl ethyl ketone, methyl n-propyl ketone, methyl n-butyl ketone, diethyl ketone, methyl iso-butyl ketone, methyl n-pentyl ketone, ethyl n-butyl ketone, methyl n-hexyl ketone, di-iso-butyl ketone, trimethylnonanone, cyclopentanone, cyclohexanone, cycloheptanone, cyclooctanone, 2-hexanone, methyl cyclohexanone, 2,4-pentane dione, acetonyl acetone, and diacetone alcohol; and the like can be given.

The total concentration of the component (B) and the component (A) in the organic solvent is preferably 1 to 30 wt %.

The hydrolysis-condensation temperature is 0 to 100° C., and preferably 20 to 80° C., and the reaction time is 30 to 1,000 minutes, and preferably 30 to 180 minutes.

Although there are no specific limitations to the order of adding each component, a method of adding a solution of the component (A) in an organic solvent and a solution of the component (B) in an organic solvent to an organic solvent containing the basic catalyst (C) is preferably used.

The polystyrene-reduced weight average molecular weight of the specific hydrolysis-condensation product is preferably 1,500 to 500,000, more preferably 2,000 to 200,000, and still more preferably f2,000 to 100,000. If the polystyrene-reduced weight average molecular weight of the specific hydrolysis-condensation product is less than 1,500, the target low dielectric constant may not be achieved. If the polystyrene-reduced weight average molecular weight is more than 500,000, the resulting coating may exhibit poor inplane uniformity.

1.5. Organic Solvent

As the organic solvent used in the insulating-film-forming composition, at least one solvent selected from the group consisting of alcohol solvents, ketone solvents, amide solvents, ether solvents, ester solvents, aliphatic hydrocarbon solvents, aromatic solvents, and halogen-containing solvents can be given.

Examples of the alcohol solvents include: monohydric alcohols such as methanol, ethanol, n-propanol, iso-propanol, n-butanol, iso-butanol, sec-butanol, t-butanol, n-pentanol, iso-pentanol, 2-methylbutanol, sec-pentanol, t-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol, and diacetone alcohol; polyhydric alcohols such as ethylene glycol, 1,2-polyethylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, and tripropylene glycol; polyhydric alcohol partial ether solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, and dipropylene glycol monopropyl ether; and the like. These alcohol solvents may be used either individually or in combination of two or more.

As examples of the ketone solvents, acetone, methyl ethyl ketone, methyl n-propyl ketone, methyl n-butyl ketone, diethyl ketone, methyl i-butyl ketone, methyl n-pentyl ketone, ethyl n-butyl ketone, methyl n-hexyl ketone, di-i-butyl ketone, trimethylenonane, cyclopentanone, cyclohexanone, cycloheptanone, cyclooctanone, 2-hexanone, methylcyclohexanone, 2,4-pentanedione, acetonylacetone, diacetone alcohol, acetophenone, fenchone, and the like can be given. These ketone solvents may be used either individually or in combination of two or more.

As examples of the amide solvents, nitrogen-containing solvents such as N,N-dimethylimidazolidinone, N-methylformamide, N,N-dimethylformamide, N,N-dimethylformamide, acetamide, N-methylacetamide, N,N-dimethylacetamide, N-methylpropioneamide, N-methylpyrrolidone, and the like can be given. These amide solvents may be used either individually or in combination of two or more.

As examples of the ether solvents, ethyl ether, i-propyl ether, n-butyl ether, n-hexyl ether, 2-ethylhexyl ether, ethylene oxide, 1,2-propylene oxide, dioxolane, 4-methyl dioxolane, dioxane, dimethyl dioxane, ethylene glycol monomethyl ether, ethylene glycol dimethyl ether, ethylene glycol monoethyl ether, ethylene glycol diethyl ether, ethylene glycol mono-n-butyl ether, ethylene glycol mono-n-hexyl ether, ethylene glycol monophenyl ether, ethylene glycol mono-2-ethyl butyl ether, ethylene glycol dibutyl ether, diethylene glycol monomethyl ether, diethylene glycol dimethyl ether, diethylene glycol monoethyl ether, diethylene glycol diethyl ether, diethylene glycol mono-n-butyl ether, diethylene glycol di-n-butyl ether, diethylene glycol mono-n-hexyl ether, ethoxy triglycol, tetraethylene glycol di-n-butyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether, tripropylene glycol monomethyl ether, tetrahydrofuran, 2-methyltetrahydrofuran, diphenyl ether, anisole, and the like can be given. These ether solvents may be used either individually or in combination of two or more.

As examples of the ester solvents, diethyl carbonate, propylene carbonate, methyl acetate, ethyl acetate, gamma-butyrolactone, gamma-valerolactone, n-propyl acetate, i-propyl acetate, n-butyl acetate, i-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxy triglycol acetate, ethyl propionate, n-butyl propionate, i-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like can be given. These ester solvents may be used either individually or in combination of two or more.

As examples of the aliphatic hydrocarbon solvents, n-pentane, i-pentane, n-hexane, i-hexane, n-heptane, i-heptane, 2,2,4-trimethylpentane, n-octane, i-octane, cyclohexane, methylcyclohexane, and the like can be given. These aliphatic hydrocarbon solvents may be used either individually or in combination of two or more.

As examples of the aromatic hydrocarbon solvents, benzene, toluene, xylene, ethylbenzene, trimethylbenzene, methylethylbenzene, n-propylebenzene, i-propylebenzene, diethylbenzene, i-butylbenzene, triethylbenzene, di-i-propylbenzene, n-amylnaphthalene, trimethylbenzene, and the like can be given. These aromatic hydrocarbon solvents may be used either individually or in combination of two or more. As examples of the halogen-containing solvents, dichloromethane, chloroform, fluorocarbon, chlorobenzene, dichlorobenzene, and the like can be given.

In this embodiment, it is preferable to use an organic solvent having a boiling point of less than 150° C. As the type of solvent, an alcohol solvent, a ketone solvent, and an ester solvent are particularly preferable. It is preferable to use one or more of these solvents.

The organic solvent may be the organic solvent used for the synthesis of the specific hydrolysis-condensation product, or a solvent may be replaced with a desired organic solvent after completion of the synthesis of the specific hydrolysis-condensation product.

1.6. Additives

Additives such as an organic polymer or a surfactant may be added to the insulating-film-forming composition. These additives may be added to the solvent in which either the component (A) or the component (B) is dissolved or dispersed before mixing the component (A) and the component (B).

1.6.1. Organic Polymer

As examples of the organic polymer, a polymer having a sugar chain structure, vinyl amide polymer, (meth)acrylic polymer, aromatic vinyl compound polymer, dendrimer, polyimide, polyamic acid, polyarylene, polyamide, polyquinoxaline, polyoxadizole, fluorine-containing polymer, polymer having a polyalkylene oxide structure, and the like can be given.

As the polyalkylene oxide structure, a polymethylene oxide structure, polyethylene oxide structure, polypropylene oxide structure, polytetramethylene oxide structure, polybutylene oxide structure, and the like can be given.

As specific examples of the compound having a polyalkylene oxide structure, ether compounds such as polyoxymethylene alkyl ether, polyoxyethylene alkyl ether, polyoxyethylene alkylphenyl ether, polyoxyethylene sterol ether, polyoxyethylene lanolin derivatives, ethylene oxide derivatives of alkylphenol formalin condensate, polyoxyethylene polyoxypropylene block copolymers, and polyoxyethylene polyoxypropylene alkyl ethers; ether-ester compounds such as polyoxyethylene glyceride, polyoxyethylene sorbitan fatty acid ester, polyoxyethylene sorbitol fatty acid ester, and polyoxyethylene fatty acid alkanolamide sulfate; ester compounds such as polyethylene glycol fatty acid ester, ethylene glycol fatty acid ester, fatty acid monoglyceride, polyglycerol fatty acid ester, sorbitan fatty acid ester, propylene glycol fatty acid ester, and sucrose fatty acid ester, and the like can be given.

As examples of the polyoxyethylene polyoxypropylene block copolymer, compounds having the following block structure can be given.

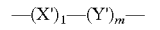

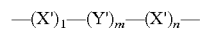

wherein X' represents a group —$CH_2CH_2O$—, Y' represents a group —$CH_2CH(CH_3)O$—, 1 represents an integer from 1 to 90, m represents an integer from 10 to 99, and n represents an integer from 0 to 90.

Of these compounds, the ether compounds such as polyoxyethylene alkyl ether, polyoxyethylene-polyoxypropylene block copolymer, polyoxyethylene polyoxypropylene alkyl ether, polyoxyethylene glyceride, polyoxyethylene sorbitan fatty acid ester, and polyoxyethylene sorbitol fatty acid ester are preferable. The organic polymers may be used either individually or in combination of two or more.

1.6.2. Surfactant

As examples of the surfactant, a nonionic surfactant, an anionic surfactant, a cationic surfactant, an amphoteric surfactant, and the like can be given. As specific examples, a fluorine-containing surfactant, a silicone surfactant, a polyalkylene oxide surfactant, a poly(meth)acrylate surfactant, and the like can be given. Of these, the fluorine-containing surfactant and the silicone surfactant are preferable.

The surfactant is used in an amount of usually 0.00001 to 1 part by weight for 100 parts by weight of the obtained polymer. The surfactants may be used either individually or in combination of two or more.

2. Method of Forming Film

The method of forming a film (insulating film) according to one embodiment of the invention includes applying the film-forming composition to a substrate to form a coating, and heating the coating.

As examples of the substrate to which the film-forming composition is applied, Si-containing layers such as layers formed of Si, $SiO_2$, SiN, SiC, SiCN, and the like can be given. As the method of applying the film-forming composition to the substrate, a coating method such as spin coating, dip coating, roll coating, or spray coating may be used. After applying the film-forming composition to the substrate, the solvent is removed to form a coating. A coating with a dry thickness of 0.05 to 2.5 microns is obtained by single application, and a coating with a dry thickness of 0.1 to 5.0 microns is obtained by double application. A silica-based film may be formed by subjecting the resulting coating to a curing treatment.

As the curing treatment, heating, electron beam irradiation, ultraviolet irradiation, plasma treatment, and the like can be given.

When curing the coating, the coating is heated at 80 to 450° C. in an inert gas atmosphere or under reduced pressure. A hot plate, oven, furnace, or the like may be used for heating in an inert gas atmosphere or under reduced pressure.

An appropriate measure such as step-wise heating, selection of the heating atmosphere such as use of nitrogen, air, oxygen, or reduced pressure may be optionally employed to control the curing rate of the coating. A silica-based film can be produced by these steps.

3. Silica-Based Film (Silica-Based Insulating Film)

Since the silica-based film according to one embodiment of the invention exhibits a low dielectric constant and excellent surface flatness, the silica-based film is particularly useful as an interlayer dielectric for semiconductor devices such as an LSI, system LSI, DRAM, SDRAM, RDRAM, or D-RDRAM. Moreover, the silica-based film may be suitably used as an etching stopper film, a protective film such as a surface coating film for semiconductor devices, an intermediate layer used in the semiconductor manufacturing process using a multilayer resist, an interlayer dielectric for multilayer wiring boards, a protective film and an insulating film for liquid crystal display elements, and the like.

4. Examples

The invention is described below in more detail by way of examples. Note that the invention is not limited to the following examples. In the examples and comparative examples, "part" and "%" respectively refer to "part by weight" and "wt %" unless otherwise indicated.

4.1. Evaluation Method

Each item was evaluated as follows.

4.1.1. Relative Dielectric Constant

The film-forming composition was applied to an 8-inch silicon wafer by spin coating. The coating was dried on a hot plate at 90° C. for three minutes and at 200° C. for three minutes in a nitrogen atmosphere, and sintered in a vertical furnace at 420° C. for one hour under reduced pressure of 50 mTorr. An aluminum electrode pattern was formed on the resulting film by deposition to obtain a relative dielectric constant measurement sample. The relative dielectric constant of the sample was measured by a CV method at a frequency of 100 kHz using an electrode "HP 16451B" and a precision LCR meter "HP 4284A" manufactured by Yokogawa-Hewlett-Packard, Ltd.

4.1.2. Evaluation of Hardness and Modulus of Elasticity (Young's Modulus) of Insulating Film A Berkovich type indenter was installed in a nanohardness tester (Nanoindentator XP) manufactured by MTS, and the universal hardness of the insulating film was determined. The modulus of elasticity was measured by the continuous stiffness measuring method.

4.1.3. Storage Stability

The film-forming composition stored at 40° C. for 30 days was applied to a substrate by spin coating. The substrate was dried on a hot plate at 90° C. for three minutes and at 200° C. for three minutes in a nitrogen atmosphere, and sintered in a vertical furnace at 420° C. for one hour under reduced pressure of 50 mTorr. The thickness of the coating thus obtained was measured at 50 points using an optical film thickness meter ("Spectra Laser 200" manufactured by Rudolph Technologies). The storage stability of the coating was evaluated by the thickness increase rate determined by applying the measured thickness to the following expression.

Thickness increase rate (%)=((thickness after storage)−(thickness before storage))/(thickness before storage)×100

A: The thickness increase rate was 4% or less.
B: The thickness increase rate was more than 4%.

4.1.4. Chemical Resistance

An 8-inch wafer on which a silica-based film was formed was immersed in a 0.2% diluted hydrofluoric acid aqueous solution at room temperature for one minute, and a change in the thickness of the silica-based film before and after immersion was determined. The chemical resistance was judged to be excellent when the residual film rate defined below was 99% or more.

Residual film rate (%)=(thickness after immersion)/(thickness before immersion)×100

A: The residual film rate was 99% or more.
B: The residual film rate was less than 99%.

4.1.5. Phase Separation in Film

The cross section of the insulating film was processed for observation by a focused ion beam method, and the outward appearance of the cross section was observed using a transmission electron microscope (TEM) at a magnification of 18,000. The observation results were classified as follows.

A: A coating with a uniform cross-sectional shape was observed.
B: An island-like domain phase separation was observed in the coating.

4.2. Preparation of Film-forming Composition 4.2.1. Example 1

2.71 g of a 40% methylamine aqueous solution, 187.36 g of ultrapure water, and 425.22 g of ethanol were put into a flask made of quartz equipped with a condenser. The mixture was then stirred at 60° C. After the addition of 48.77 g of methyltrimethoxysilane, 31.96 g of tetraethoxysilane, and 3.98 g of polycarbosilane (Mw=800) of the following structural formula (6), the mixture was stirred at 60° C. for six hours to obtain a reaction liquid containing a hydrolysis-condensation product with a polystyrene-reduced weight average molecular weight of 45,000. After cooling the reaction liquid to room temperature, 612.58 g of propylene glycol monopropyl ether and 31.49 g of a 20% acetic acid aqueous solution were added. The reaction liquid was concentrated under reduced pressure until the solid content became 10% to obtain a film-forming composition 1.

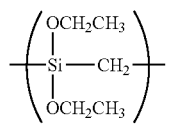

(6)

4.2.2. Example 2

14.68 g of a 20% tetrapropyl ammonium hydroxide aqueous solution, 161.71 g of ultrapure water, and 474.70 g of isopropanol were put into a flask made of quartz equipped with a condenser. The mixture was then stirred at 60° C. After the addition of 27.86 g of methyltrimethoxysilane, 13.52 g of tetrapropoxysilane, and 7.53 g of polycarbosilane (Mw=840) of the following structural formula (7), the mixture was stirred at 60° C. for four hours to obtain a reaction liquid containing a hydrolysis-condensation product with a polystyrene-reduced weight average molecular weight of 55,000. After cooling the reaction liquid to room temperature, 636.41 g of propylene glycol monopropyl ether and 13.01 g of a 20% acetic acid aqueous solution were added. The reaction liquid was concentrated under reduced pressure until the solid content became 10% to obtain a film-forming composition 2.

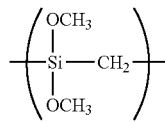

(7)

4.2.3. Example 3

6.77 g of a 25% tetramethyl ammonium hydroxide aqueous solution, 162.26 g of ultrapure water, and 488.58 g of ethanol were put into a flask made of quartz equipped with a condenser. The mixture was then stirred at 60° C. After the addition of 6.08 g of dimethyldimethoxysilane, 17.23 g of methyltrimethoxysilane, 11.55 g of tetramethoxysilane, and 7.53 g of polycarbosilane (Mw=840) of the following structural formula (8), the mixture was stirred at 60° C. for two hours to obtain a reaction liquid containing a hydrolysis-condensation product with a polystyrene-reduced weight average molecular weight of 40,000. After cooling the reaction liquid to room temperature, 650.84 g of propylene glycol monopropyl ether and 12.83 g of a 20% acetic acid aqueous solution were added. The reaction liquid was concentrated under reduced pressure until the solid content became 10% to obtain a film-forming composition 3.

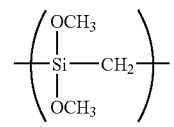

(8)

4.2.4. Example 4

21.80 g of a 20% tetrapropyl ammonium hydroxide aqueous solution, 175.77 g of ultrapure water, and 448.39 g of isopropanol were put into a flask made of quartz equipped with a condenser. The mixture was then stirred at 80° C. After the addition of 20.24 g of methyltrimethoxysilane, 30.95 g of tetraethoxysilane, and 2.84 g of polycarbosilane (Mw=1200) of the following structural formula (9), the mixture was stirred at 80° C. for eight hours to obtain a reaction liquid containing a hydrolysis-condensation product with a polystyrene-reduced weight average molecular weight of 48,000. After cooling the reaction liquid to room temperature, 624.16 g of propylene glycol monopropyl ether and 19.32 g of a 20% acetic acid aqueous solution were added. The reaction liquid was concentrated under reduced pressure until the solid content became 10% to obtain a film-forming composition 4.

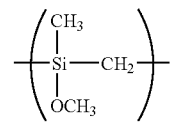

(9)

4.2.5. Example 5

12.03 g of a 25% tetramethyl ammonium hydroxide aqueous solution, 14.76 g of ultrapure water, and 635.58 g of methyl isobutyl ketone were put into a flask made of quartz equipped with a condenser. The mixture was then stirred at 40° C. After the addition of 24.19 g of methyltrimethoxysilane, 12.11 g of tetraethoxysilane, and 1.32 g of polycarbosilane (Mw=1000) of the following structural formula (10) over one hour, the mixture was stirred at 80° C. for one hour to obtain a reaction liquid containing a hydrolysis-condensation product with a polystyrene-reduced weight average molecular weight of 37,000. After cooling the reaction liquid to room temperature, 1300.68 g of propylene glycol monopropyl ether and 29.73 g of a 20% acetic acid aqueous solution were added. The reaction liquid was concentrated under reduced pressure until the solid content became 10% to obtain a film-forming composition 5.

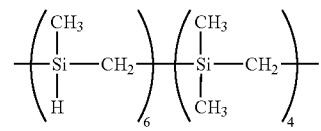

(10)

4.2.6. Example 6

A 4-liter four-neck flask equipped with a thermometer, condenser, dripping funnel, and stirrer, of which the atmosphere was replaced with argon gas, was charged with 1.5 liters of dry tetrahydrofuran and 71 g of magnesium. Argon gas was then bubbled into the mixture. 500 g of chloromethyltriethoxysilane was slowly added to the mixture through the dripping funnel with stirring at 0° C.

After the addition, the mixture was stirred at 0° C. for 12 hours. After the addition of hexane to the reaction liquid, the mixture was filtered through celite. The organic solvent was then completely removed using a vacuum oven to obtain 414 g of a brown liquid polymer (A). The weight average molecular weight of the resulting polymer (A) was 420.

9 g of the polymer (A), 30 g of methyltrimethoxysilane, and 3.4 g of tetramethoxysilane were mixed with 60 ml of tetrahydrofuran. After cooling the mixed solution to 0° C., a mixed aqueous solution of 0.46 ml of a 40% methylamine aqueous solution and 30 ml of water was slowly added. The mixture was allowed to react for 30 minutes. The mixture was then heated to 50° C. and allowed to react for six hours to obtain a reaction liquid containing a hydrolysis-condensation product with a polystyrene-reduced weight average molecular weight of 35,000. The reaction liquid was then allowed to cool and diluted with 250 ml of diethyl ether. The resulting solution was washed with distilled water three to four times until the pH of the solution became neutral. After the addition of 200 g of propylene glycol monopropyl ether to the solution, the mixture was concentrated at 50° C. using an evaporator until the solid content became 20% (as complete hydrolysis-condensation product). Then, 20 g of a 10% propylene glycol monopropyl ether solution of maleic acid was added to the concentrate to obtain a film-forming composition 6.

4.2.7. Comparative Example 1

In a flask made of quartz equipped with a condenser, 58.87 g of methyltrimethoxysilane, 50.26 g of tetramethoxysilane, and 26.42 g of polycarbosilane (Mw=1,000) of the following structural formula (11) were dissolved in a mixed solvent of 232.99 g of isopropanol and 232.99 g of methyl isobutyl ketone. The mixture was stirred using a three-one motor to stabilize the temperature of the solution at 55° C. Then, 98.06 g of ion-exchanged water, in which 0.41 g of oxalic acid was dissolved, was added to the solution over one hour. The mixture was allowed to react at 55° C. for three hours to obtain a reaction liquid containing a hydrolysis-condensation product with a polystyrene-reduced weight average molecular weight of 2,000. After the addition of 931.96 g of propylene glycol monoethyl ether, the reaction liquid was cooled to room temperature. The reaction liquid was then concentrated under reduced pressure until the solid content became 10% to obtain a film-forming composition 7.

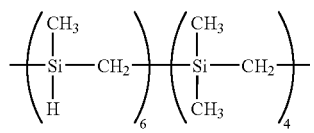

(11)

4.2.8. Comparative Example 2

In a flask made of quartz equipped with a condenser, 123.21 g of methyltrimethoxysilane, 59.01 g of tetramethoxysilane, and 100.39 g of polycarbosilane (Mw=840) of the following structural formula (12) were dissolved in 193.35 g of propylene glycol monoethyl ether. The mixture was stirred using a three-one motor to stabilize the temperature of the solution at 55° C. Then, 223.12 g of ion-exchanged water, in which 0.93 g of oxalic acid was dissolved, was added to the solution over one hour. The mixture was allowed to react at 55° C. for one hour to obtain a reaction liquid containing a hydrolysis-condensation product with a polystyrene-reduced weight average molecular weight of 2300. After the addition of 825.50 g of propylene glycol monoethyl ether, the reaction liquid was cooled to room temperature. The reaction liquid was concentrated under reduced pressure until the solid content became 10% to obtain a film-forming composition 8.

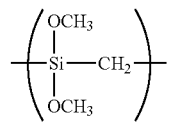

(12)

4.2.8. Comparative Example 3

In a flask made of quartz equipped with a condenser, 92.40 g of methyltrimethoxysilane, 44.25 g of tetramethoxysilane, and 56.85 g of polycarbosilane (w=1200) of the following structural formula (13) were dissolved in 402.05 g of propylene glycol monoethyl ether. The mixture was stirred using a three-one motor to stabilize the temperature of the solution at 55° C. Then, 103.85 g of ion-exchanged water, in which 0.58 g of oxalic acid was dissolved, was added to the solution over one hour. The mixture was allowed to react at 55° C. for one hour to obtain a reaction liquid containing a hydrolysis-condensation product with a polystyrene-reduced weight average molecular weight of 2500. After the addition of 1007.25 g of propylene glycol monoethyl ether, the reaction liquid was cooled to room temperature. The reaction liquid was concentrated under reduced pressure until the solid content became 10% to obtain a film-forming composition 9.

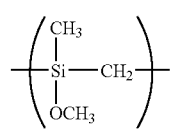

(13)

4.2.9. Comparative Example 4

In a flask made of quartz equipped with a condenser, 139.30 g of methyltrimethoxysilane, 38.92 g of tetramethoxysilane, and 127.42 g of polycarbosilane (Mw=800) of the following structural formula (14) were dissolved in 105.34 g of propylene glycol monoethyl ether. After the addition of 216.87 g of ion-exchanged water, the solution was stirred at room temperature for one hour. Then, a solution of 0.141 g of tetrakis(acetylacetonato)titanium dissolved in 37.01 g of propylene glycol monoethyl ether was added. The mixture was allowed to react at 50° C. for three hours to obtain a reaction liquid containing a hydrolysis-condensation product with a polystyrene-reduced weight average molecular weight of 1,200. 718.44 g of propylene glycol monoethyl ether, the reaction liquid was cooled to room temperature. The reaction liquid was concentrated under reduced pressure until the solid content became 10% to obtain a film-forming composition 10.

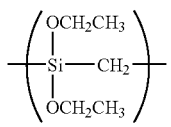

(14)

4.2.10. Comparative Example 5

In a flask made of quartz equipped with a condenser, 19.01 g of dimethyldimethoxysilane, 53.84 g of methyltrimethoxysilane, 36.10 g of tetramethoxysilane, and 94.12 g of polycarbosilane (Mw=840) of the following structural formula (15) were dissolved in 256.34 g of propylene glycol monoethyl ether. After the addition of 115.07 g of ion-exchanged water, the solution was stirred at room temperature for one hour. Then, a solution of 0.106 g of tetrakis(acetylacetonato) titanium dissolved in 90.16 g of propylene glycol monoethyl ether was added. The mixture was then allowed to react at 50° C. for six hours to obtain a reaction liquid containing a hydrolysis-condensation product with a polystyrene-reduced weight average molecular weight of 1500. After the addition of 923.68 g of propylene glycol monoethyl ether, the reaction liquid was cooled to room temperature. The reaction liquid was concentrated under reduced pressure until the solid content became 10% to obtain a film-forming composition 11.

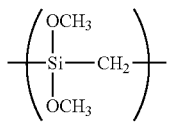

(15)

4.2.11. Comparative Example 6

2.51 g of a 40% methylamine aqueous solution, 173.26 g of ultrapure water, and 444.43 g of ethanol were put into a flask made of quartz equipped with a condenser. The mixture was then stirred at 60° C. After the addition of 42.83 g of methyltrimethoxysilane and 28.07 g of tetraethoxysilane, the mixture was stirred at 60° C. for six hours to obtain a reaction liquid containing a hydrolysis-condensation product with a polystyrene-reduced weight average molecular weight of 60,000. After cooling the reaction liquid to room temperature, 617.69 g of propylene glycol monopropyl ether and 26.47 g of a 20% acetic acid aqueous solution were added. The reaction liquid was concentrated under reduced pressure until the solid content became 10% to obtain a film-forming composition 12.

4.2.12. Comparative Example 7

17.86 of polycarbosilane (Mw=840) of the following structural formula (16) was added to 111.90 g of the insulating-film-forming composition (composition 7) with a solid content of 10% prepared in Comparative Example 6. The mixture was stirred at 50° C. for six hours. After the addition of 415.72 g of propylene glycol monoethyl ether, the mixture was concentrated under reduced pressure until the solid content became 10% to obtain a film-forming composition 13.

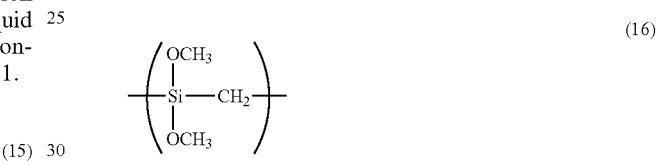

(16)

4.3. Evaluation Results

The film-forming compositions 1 to 13 obtained in Examples 1 to 6 and Comparative Examples 1 to 7 were evaluated for the relative dielectric constant, modulus of elasticity, hardness, chemical resistance, storage stability, and observation of the cross section. The evaluation results are shown in Table 1.

TABLE 1

| | Dielectric constant | Modulus of elasticity (GPa) | Hardness (GPa) | Chemical resistance | Storage stability | Observation of cross section |
|---|---|---|---|---|---|---|
| Example 1 | 2.3 | 5.5 | 0.99 | A | A | A |
| Example 2 | 2.2 | 3.1 | 0.60 | A | A | A |
| Example 3 | 2.3 | 3.1 | 0.59 | A | A | A |
| Example 4 | 2.3 | 4.1 | 0.70 | A | A | A |
| Example 5 | 2.4 | 5.2 | 0.87 | A | A | A |
| Example 6 | 2.6 | 4.8 | 0.81 | A | A | A |
| Comparative Example 1 | 3.0 | 5.1 | 0.87 | A | A | B |
| Comparative Example 2 | 3.1 | 5.5 | 0.99 | A | B | A |
| Comparative Example 3 | 2.8 | 5.4 | 0.88 | A | B | A |
| Comparative Example 4 | 2.9 | 6.8 | 0.71 | A | B | A |
| Comparative Example 5 | 2.8 | 5.9 | 0.80 | A | B | A |
| Comparative Example 6 | 2.2 | 3.5 | 0.48 | B | A | A |
| Comparative Example 7 | 2.5 | 4.2 | 0.51 | A | B | B |

As shown in Table 1, it was confirmed that the film-forming compositions of Examples 1 to 6 exhibit a low relative dielectric constant in comparison with the film-forming compositions of Comparative Examples 1 to 5 and 7, and can form a film with an improved modulus of elasticity and hardness. It was also confirmed that the film-forming compositions of Examples 1 to 6 exhibit excellent storage stability in comparison with the film-forming compositions of Comparative Examples 2 to 5 and 7.

In Comparative Example 1, the basic catalyst used in Example 5 was replaced with the acid catalyst. The comparison between Comparative Example 1 and Example 5 suggests that a uniform film without phase separation can be produced by using the basic catalyst for hydrolysis-condensation.

In Comparative Example 6, in which hydrolysis-condensation was carried out in the absence of the polycarbosilane, chemical resistance deteriorated. This indicates that it is advantageous to carry out hydrolysis-condensation in the presence of the polycarbosilane.

As described above, the silica-based film obtained according to one embodiment of the invention exhibits excellent mechanical strength, a low relative dielectric constant, excellent chemical resistance, and superior storage stability, and may be suitably used as an interlayer dielectric for semiconductor devices and the like.

What is claimed is:

1. An insulating-film-forming composition, comprising:
a hydrolysis-condensation product obtained by hydrolyzing and condensing a hydrolyzable-group-containing silane monomer (A) in the presence of a polycarbosilane (B) including a hydrolyzable group and a basic catalyst (C); and
an organic solvent,
wherein the component (A) is at least one silane compound selected from the group consisting of compounds of the following general formulas (1) to (3),

R$_a$Si(OR$^1$)$_{4-a}$ (1)

wherein R represents a hydrogen atom, a fluorine atom, or a monovalent organic group, R$^1$ represents a monovalent organic group, and a represents 1 or 2, Si(OR$^2$)$_4$ (2)

wherein R$^2$ represents a monovalent organic group,

R$^3{}_b$(R$^4$O)$_{3-b}$Si—(R$^7$)$_d$—Si(OR$^5$)$_{3-c}$R$^6{}_c$ (3)

wherein R$^3$ to R$^6$ individually represent monovalent organic groups, b and c individually represent integers from 0 to 2, R$^7$ represents an oxygen atom, a phenylene group, or a group —(CH$_2$)$_m$— (wherein m represents an integer from 1 to 6), and d represents 0 or 1,
and the component (B) is a polycarbosilane compound of the following general formula (4), (4)
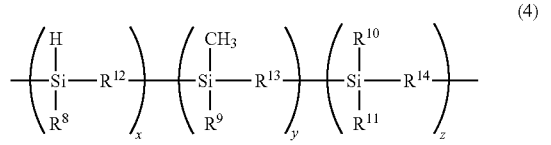

wherein R$^8$ represents a group selected from the group consisting of a hydrogen atom, a halogen atom, a hydroxyl group, an alkoxy group, an acyloxyl group, a sulfone group, a methanesulfone group, a trifluoromethanesulfone group, an alkyl group, an aryl group, an allyl group, and a glycidyl group, R$^9$ represents a group selected from the group consisting of a halogen atom, a hydroxyl group, an alkoxy group, an acyloxyl group, a sulfone group, a methanesulfone group, a trifluoromethanesulfone group, an alkyl group, an aryl group, an allyl group, and a glycidyl group, R$^{10}$ and R$^{11}$ individually represent groups selected from the group consisting of a halogen atom, a hydroxyl group, an alkoxy group, an acyloxyl group, a sulfone group, a methanesulfone group, a trifluoromethanesulfone group, an alkyl group having 2 to 6 carbon atoms, an aryl group, an allyl group, and a glycidyl group, R$^{12}$ to R$^{14}$ individually represent a substituted or unsubstituted methylene group, a substituted or unsubstituted alkylene group, a substituted or unsubstituted alkenyl group, a substituted or unsubstituted alkynyl group, or a substituted or unsubstituted arylene group, and x, y, and z individually represent integers from 0 to 10,000, provided that "5<x+y+z<10,000" is satisfied,
and wherein the amount of the component (B) is 5 to 100 parts by weight for 100 parts by weight of the component (A) converted into a complete hydrolysis-condensation product.

2. The insulating-film-forming composition according to claim 1, wherein the basic catalyst (C) is a nitrogen-containing compound of the following general formula (5),

(X$^1$X$^2$X$^3$X$^4$N)$_a$Y (5)

wherein X$^1$, X$^2$, X$^3$, and X$^4$ individually represent groups selected from the group consisting of a hydrogen atom, an alkyl group having 1 to 20 carbon atoms, a hydroxyalkyl group, an aryl group, and an arylalkyl group, Y represents a halogen atom or an anionic group with a valence of 1 to 4, and a represents an integer from 1 to 4.

3. The insulating-film-forming composition according to claim 1, wherein component (A) is at least the compound shown by general formula (1).

4. The insulating-film-forming composition according to claim 1, wherein component (A) is at least the compound shown by general formula (2).

5. The insulating-film-forming composition according to claim 1, wherein component (A) is at least the compound shown by general formula (3).

6. The insulating-film-forming composition according to claim 3, wherein the compound shown by general formula (1) is selected from the group consisting of methyltrimethoxysilane, methyltriethoxysilane, methyltri-n-propoxysilane, methyltri-iso-propoxysilane, ethyltrimethoxysilane, ethyltriethoxysilane, vinyltrimethoxysilane, vinyltriethoxysilane, phenyltrimethoxysilane, phenyltriethoxysilane, dimethyldimethoxysilane, dimethyldiethoxysilane, diethyldimethoxysilane, diethyldiethoxysilane, diphenyldimethoxysilane, and diphenyldiethoxysilane.

7. The insulating-film-forming composition according to claim 4, wherein the compound shown by general formula (2) is selected from the group consisting of tetramethoxysilane and tetraethoxysilane.

8. The insulating-film-forming composition according to claim 5, wherein d is 0 and the compound shown by general formula (3) is selected from the group consisting of hexamethoxydisilane, hexaethoxydisilane, 1,1,2,2-tetramethoxy-1,2-dimethyldisilane, 1,1,2,2-tetraethoxy-1,2-dimethyldisilane, 1,1,2,2-tetramethoxy-1,2-diphenyldisilane, 1,2-dimethoxy-1,1,2,2-tetramethyldisilane, 1,2-diethoxy-1,1,2,2-tetramethyldisilane, 1,2-dimethoxy-1,1,2,2-tetraphenyldisilane, and 1,2-diethoxy-1,1,2,2-tetraphenyldisilane.

9. The insulating-film-forming composition according to claim 5, wherein d is 1 and the compound shown by general formula (3) is selected from the group consisting of bis(trimethoxysilyl)methane, bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, and 1,4-bis(triethoxysilyl)benzene.

10. The insulating-film-forming composition according to claim 1, wherein 5<x+y+z<100.

11. The insulating-film-forming composition according to claim 2, wherein the basic catalyst (C) is at least one selected from the group consisting of tetramethylammonium hydroxide, tetraethylammonium hydroxide, tetra-n-propylammonium hydroxide, tetra-n-butylammonium hydroxide, tetramethylammonium bromide, tetramethylammonium chloride, tetraethylammonium bromide, tetraethylammonium chloride, tetra-n-propylammonium bromide, and tetra-n-propylammonium chloride.

12. A method of producing an insulating-film-forming composition, comprising hydrolyzing and condensing a hydrolyzable-group-containing silane monomer (A) in the presence of a polycarbosilane (B) including a hydrolyzable group and a basic catalyst (C), wherein the component (A) is at least one silane compound selected from the group consisting of compounds of the following general formulas (1) to (3),

  (1)

wherein R represents a hydrogen atom, a fluorine atom, or a monovalent organic group, $R^1$ represents a monovalent organic group, and a represents 1 or 2,

  (2)

wherein $R^2$ represents a monovalent organic group,

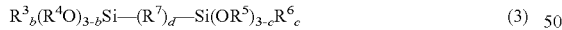  (3)

wherein $R^3$ to $R^6$ individually represent monovalent organic groups, b and c individually represent integers from 0 to 2, $R^7$ represents an oxygen atom, a phenylene group, or a group —$(CH_2)_m$— (wherein m represents an integer from 1 to 6), and d represents 0 or 1, and the component (B) is a polycarbosilane compound of the following general formula (4),

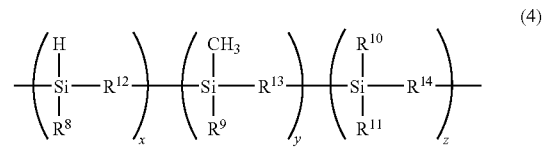  (4)

wherein $R^8$ represents a group selected from the group consisting of a hydrogen atom, a halogen atom, a hydroxyl group, an alkoxy group, an acyloxyl group, a sulfone group, a methanesulfone group, a trifluoromethanesulfone group, an alkyl group, an aryl group, an allyl group, and a glycidyl group, $R^9$ represents a group selected from the group consisting of a halogen atom, a hydroxyl group, an alkoxy group, an acyloxyl group, a sulfone group, a methanesulfone group, a trifluoromethanesulfone group, an alkyl group, an aryl group, an allyl group, and a glycidyl group, $R^{10}$ and $R^{11}$ individually represent groups selected from the group consisting of a halogen atom, a hydroxyl group, an alkoxy group, an acyloxyl group, a sulfone group, a methanesulfone group, a trifluoromethanesulfone group, an alkyl group having 2 to 6 carbon atoms, an aryl group, an allyl group, and a glycidyl group, $R^{12}$ to $R^{14}$ individually represent a substituted or unsubstituted methylene group, a substituted or unsubstituted alkylene group, a substituted or unsubstituted alkenyl group, a substituted or unsubstituted alkynyl group, or a substituted or unsubstituted arylene group, and x, y, and z individually represent integers from 0 to 10,000, provided that "5<x+y+z<10,000" is satisfied and wherein the amount of the component (B) is 5 to 100 parts by weight for 100 parts by weight of the component (A) converted into a complete hydrolysis-condensation product.

13. The method according to claim 12, further comprising dissolving a hydrolysis-condensation product obtained by the hydrolysis and condensation in an organic solvent.

14. The method according to claim 12, wherein the basic catalyst (C) is a nitrogen-containing compound of the following general formula (5),

  (5)

wherein $X^1$, $X^2$, $X^3$, and $X^4$ individually represent groups selected from the group consisting of a hydrogen atom, an alkyl group having 1 to 20 carbon atoms, a hydroxyalkyl group, an aryl group, and an arylalkyl group, Y represents a halogen atom or an anionic group with a valence of 1 to 4, and a represents an integer from 1 to 4.

15. A method of forming a silica-based insulating film, comprising applying the insulating-film-forming composition according to claim 1 to a substrate to form a coating, and subjecting the coating to at least one curing treatment selected from heating, electron beam irradiation, ultraviolet irradiation, and oxygen plasma treatment.

* * * * *